(12) United States Patent
Sato et al.

(10) Patent No.: US 10,492,351 B2
(45) Date of Patent: Nov. 26, 2019

(54) MOUNTING APPARATUS AND MEASURING METHOD

(71) Applicant: SHINKAWA LTD., Tokyo (JP)

(72) Inventors: Akira Sato, Tokyo (JP); Kohei Seyama, Tokyo (JP)

(73) Assignee: SHINKAWA LTD., Tokyo (JP)

( * ) Notice: Subject to any disclaimer, the term of this patent is extended or adjusted under 35 U.S.C. 154(b) by 353 days.

(21) Appl. No.: 15/430,562

(22) Filed: Feb. 13, 2017

(65) Prior Publication Data

US 2017/0156244 A1 Jun. 1, 2017

Related U.S. Application Data

(63) Continuation of application No. PCT/JP2014/076313, filed on Oct. 1, 2014.

(30) Foreign Application Priority Data

Aug. 13, 2014 (JP) ................................ 2014-165019

(51) Int. Cl.
*G01B 5/24* (2006.01)
*H05K 13/08* (2006.01)
*H05K 13/04* (2006.01)

(52) U.S. Cl.
CPC .............. *H05K 13/08* (2013.01); *G01B 5/24* (2013.01); *H05K 13/0404* (2013.01); *H05K 13/0812* (2018.08); *H05K 13/0813* (2018.08)

(58) Field of Classification Search
CPC ...... H05K 13/08; H05K 13/0815; G01B 5/24; G01B 5/25

(Continued)

(56) References Cited

U.S. PATENT DOCUMENTS 5,454,170 A * 10/1995 Cook .................... B23Q 17/22
33/533
5,667,129 A  9/1997 Morita et al.
(Continued)

FOREIGN PATENT DOCUMENTS

CN  1111820  11/1995
JP  H04-076931  3/1992
(Continued)

OTHER PUBLICATIONS

"Office Action of China Counterpart Application", dated Jan. 28, 2019, with English translation thereof, p. 1-p. 16.
(Continued)

*Primary Examiner* — Christopher W Fulton
(74) *Attorney, Agent, or Firm* — JCIPRNET

(57) ABSTRACT

A mounting apparatus for mounting an electronic component onto a substrate includes: a mounting tool (14) configured to hold the electronic component by a holding surface (14a) as a tip end surface of the mounting tool; a movement mechanism configured to move the mounting tool (14) relatively with respect to the substrate; an angle detection mechanism configured to measure an inclination of a planar-plated measurement jig (64) held by the holding surface (14a); and a controller configured to control driving of the mounting apparatus, wherein during inspection of the holding surface (14a), the controller causes the mounting tool (14) to hold the measurement jig (64), and the angle detection mechanism to measure the inclination of the measurement jig (64). With this, a mounting apparatus capable of measuring a condition of the holding surface of the mounting tool more correctly is provided.

3 Claims, 13 Drawing Sheets

(58) Field of Classification Search
USPC .................................. 33/534, 645, 1 BB
See application file for complete search history.

(56) References Cited

U.S. PATENT DOCUMENTS

| | | | | |
|---|---|---|---|---|
| 6,848,191 | B2* | 2/2005 | Shiraishi | G02F 1/133526 |
| | | | | 33/333 |
| 6,870,382 | B2* | 3/2005 | Harris | G01R 1/07314 |
| | | | | 324/750.22 |
| 2003/0196343 | A1* | 10/2003 | Abraham | H01L 21/67253 |
| | | | | 33/645 |
| 2005/0061852 | A1* | 3/2005 | Behler | H01L 21/67144 |
| | | | | 228/102 |
| 2008/0127486 | A1* | 6/2008 | Hirata | H01L 21/67144 |
| | | | | 29/832 |
| 2009/0055124 | A1* | 2/2009 | Herchen | G01B 5/061 |
| | | | | 702/166 |
| 2013/0333207 | A1* | 12/2013 | Lee | H05K 3/30 |
| | | | | 29/739 |
| 2015/0128436 | A1* | 5/2015 | Grimes | H01L 21/6715 |
| | | | | 33/645 |
| 2017/0186722 | A1* | 6/2017 | Zou | H01L 24/81 |
| 2018/0102340 | A1* | 4/2018 | Kim | H01L 24/75 |
| 2018/0211932 | A1* | 7/2018 | Woo | H01L 24/75 |

FOREIGN PATENT DOCUMENTS

| | | | | |
|---|---|---|---|---|
| JP | H07-303000 | | 11/1995 | |
| JP | 2000-091360 | | 3/2000 | |
| JP | 2014-017328 | | 1/2014 | |
| JP | 2014-056952 | | 3/2014 | |
| WO | WO-2016024364 A1 * | 2/2016 | ............ H05K 13/08 |

OTHER PUBLICATIONS

"Office Action of China Counterpart Application", dated Jun. 26, 2019, with English translation thereof, p. 1-p. 16.

* cited by examiner

MOUNTING APPARATUS AND MEASURING METHOD

CROSS REFERENCE TO RELATED APPLICATIONS

This application is a Continuation of PCT International Application No. PCT/JP2014/076313, filed on Oct. 1, 2014, which claims priority under 35 U.S.C. § 119(a) to Patent Application No. 2014-165019, filed in Japan on Aug. 13, 2014, all of that are hereby expressly incorporated by reference into the present application.

TECHNICAL FIELD

The disclosure relates to a mounting apparatus for mounting an electronic component onto a substrate, and a measuring method for measuring a condition of a holding surface of a mounting tool of the mounting apparatus, the mounting tool being for holding an electronic component.

BACKGROUND ART

In recent years, as performances and functionality of electronic apparatuses become improved more and more, an approach has been made in order for an electronic apparatus as a whole to be downsized and improved in functionality even if a size of the electronic component increases due to various functions provided for an electronic component constituting the electronic apparatus. With such an approach, when an electronic component is mounted onto a substrate, in order to achieve a preferred joining condition between bumps and an electrode, it is required that all of the bumps that are disposed in a distributed manner over a certain width of area be evenly brought into contact with the electrode, and that a load be applied evenly. Further, electronic components having an optical function have become used in recent years, and it is desired that such an electronic component be joined with high parallelism to a circuit board having an optical waveguide and the like.

Thus, conventionally, there is proposed a mounting apparatus for mounting an electronic component onto a substrate, the apparatus capable of, prior to mounting of an electronic component, measuring parallelism of and adjusting inclination of a holding surface of a mounting tool for holding the electronic component.

For example, PTL 1 discloses a technique for having a contact pin be embedded in a surface of a substrate stage, moving a mounting section (mounting tool) downward to bring a plurality of portions of a suction surface (holding surface) of the electronic component into contact with a tip end of the contact pin, obtaining an amount of relative movement between the mounting section and a mounting unit at this time, and obtaining a value of parallelism of the suction surface with the suction surface of the substrate stage based on the amount of relative movement. With this technique, it is possible to measure parallelism of the holding surface of the mounting tool relatively easily.

CITATION LIST

Patent Literature

Patent Literature 1: Japanese Unexamined Patent Application Publication No. 2014-17328

SUMMARY OF DISCLOSURE

Technical Problems

However, in the technique disclosed in PTL 1, parallelism of the holding surface is measured based on the result obtained when only specific portions on the holding surface of the mounting tool are brought into contact with the contact pin. However, in general, the holding surface of the mounting tool has a suction hole communicating with a negative-pressure generating source and a suction groove communicating with this suction hole. According to the technique disclosed in PTL 1, if the contact pin is brought into contact with a portion at which a suction hole or a suction groove is provided, it is not possible to measure parallelism of the holding surface in a normal way. It is of course possible to control a position at which the mounting tool is moved previously so that the contact pin may not be brought into contact with the suction hole and the suction groove. However, positions and shapes of the suction hole and the suction groove vary depending on a type of the mounting apparatus and a type of an electronic component to be mounted, and it is time-consuming to change a program for moving the mounting tool according to the positions and the shapes of the suction hole and the suction groove.

Further, according to the technique disclosed in PTL 1, while parallelism of the holding surface may be measured, it is not possible to detect attachment of a foreign matter on the holding surface. Specifically, a foreign matter such as dust is often attached to the holding surface during amounting step. When an electronic component is suctioned and held with in a state in which such a foreign matter is attached to the holding surface, the electronic component should become inclined with respect to the holding surface. In this case, parallelism of the electronic component may not be maintained even if the parallelism of the holding surface is maintained, and this results in deterioration in mounting accuracy.

Thus, the disclosure provides a mounting apparatus capable of measuring a condition of a holding surface of a mounting tool more correctly, and such a measuring method.

Solution to Problems

A mounting apparatus according to the disclosure is a mounting apparatus for mounting an electronic component onto a substrate, the apparatus including: a mounting tool configured to hold the electronic component by a holding surface as a tip end surface of the mounting tool; a movement mechanism configured to move the mounting tool relatively with respect to the substrate; a measurement jig which is planar-plated, held by the holding surface; an angle detection mechanism configured to measure an inclination of the measurement jig; and a controller configured to control driving of the mounting apparatus, wherein during inspection of the holding surface, the controller causes the mounting tool to hold the measurement jig, and the angle detection mechanism to measure the inclination of the measurement jig.

In a preferred aspect, the angle detection mechanism includes: a contact pin fixed and projecting toward the holding surface; and a calculating unit configured to calculate the inclination of the measurement jig based on relative position information of the mounting tool when the contact pin is brought into contact sequentially with a plurality of positions on a surface of the measurement jig held by the holding surface.

In another preferred aspect, the controller adjusts an inclination of the holding surface based on the inclination that has been measured. In another preferred aspect, the mounting tool further includes a tool supporting mechanism configured to either lock or unlock a posture of the mounting tool, and the controller adjusts an inclination of the holding surface by pressing a part of the holding surface against the contact pin via the measurement jig in a state in which a posture lock of the mounting tool by the tool supporting mechanism is unlocked. In another preferred aspect, the measurement jig has a size so as to cover the holding surface entirely.

A measuring method as another aspect of the disclosure is a measuring method of measuring a condition of a holding surface of a mounting tool that holds an electronic component, the method employing a mounting apparatus for mounting the electronic component onto a substrate, the method including the steps of: preparing the mounting apparatus including a mounting tool configured to hold the electronic component by the holding surface as a tip end surface of the mounting tool, and an angle detection mechanism configured to measure an inclination of a planar-plated measurement jig that is held by the holding surface; holding the planar-plated measurement jig by the holding surface of the mounting tool; measuring the inclination of the planar-plated measurement jig using the angle detection mechanism provided for the mounting apparatus; and determining whether the holding surface is pass or fail, based on the inclination of the planar-plated measurement jig that is being held.

Advantageous Effect of Disclosure

According to the disclosure, as the inclination of the measurement jig is measured by having the mounting tool hold the measurement jig, it is possible to measure the inclination of the holding surface and presence of an foreign matter on the holding surface without being affected by a suction hole and a suction groove provided for the holding surface of the mounting tool.

DESCRIPTION OF EMBODIMENT

Figure 1A:
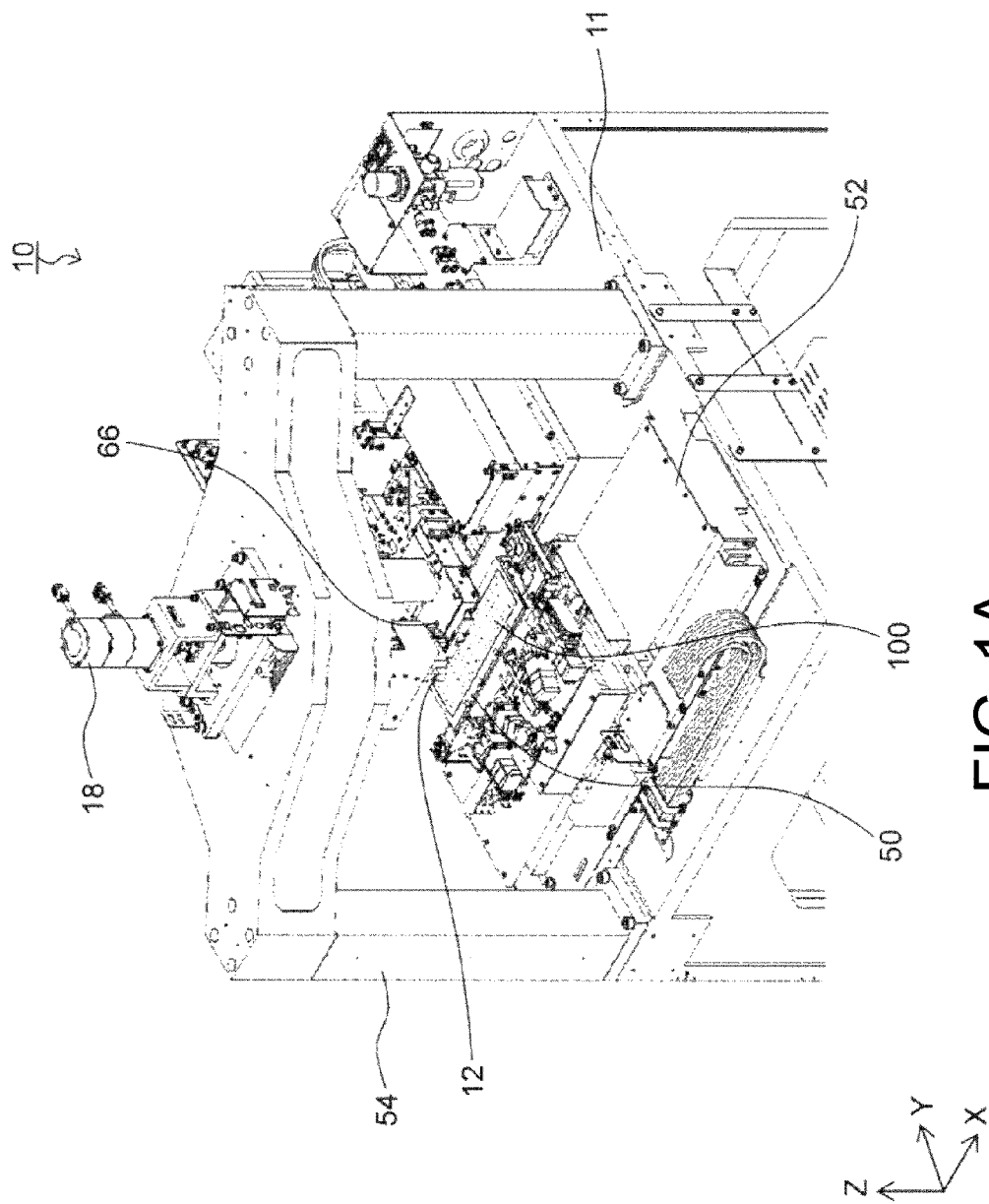
FIG. 1A is a perspective view of a mounting apparatus according to an embodiment of the disclosure.
Figure 1B:
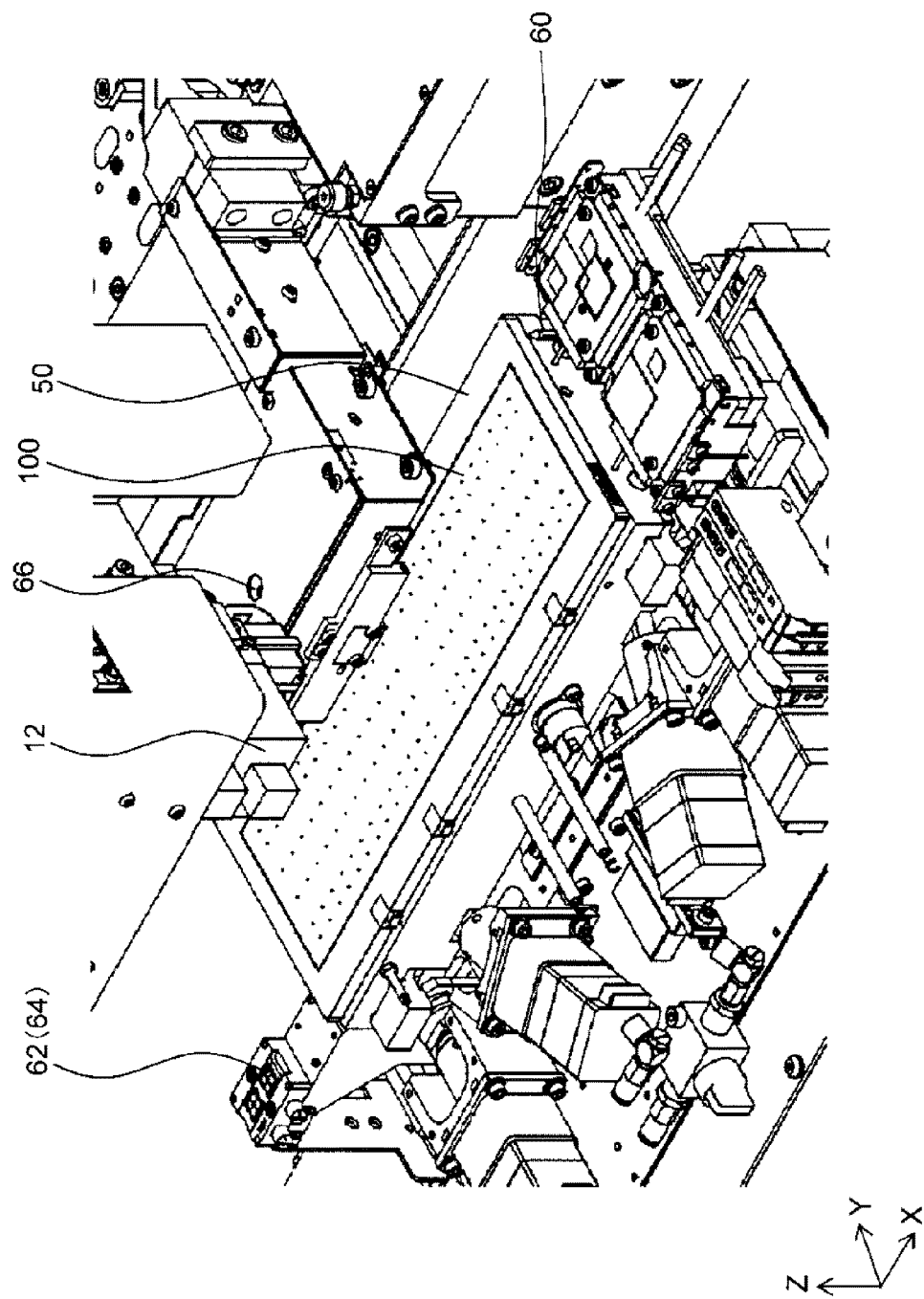
FIG. 1B is an enlarged view of a main part of the mounting apparatus.
Figure 2:
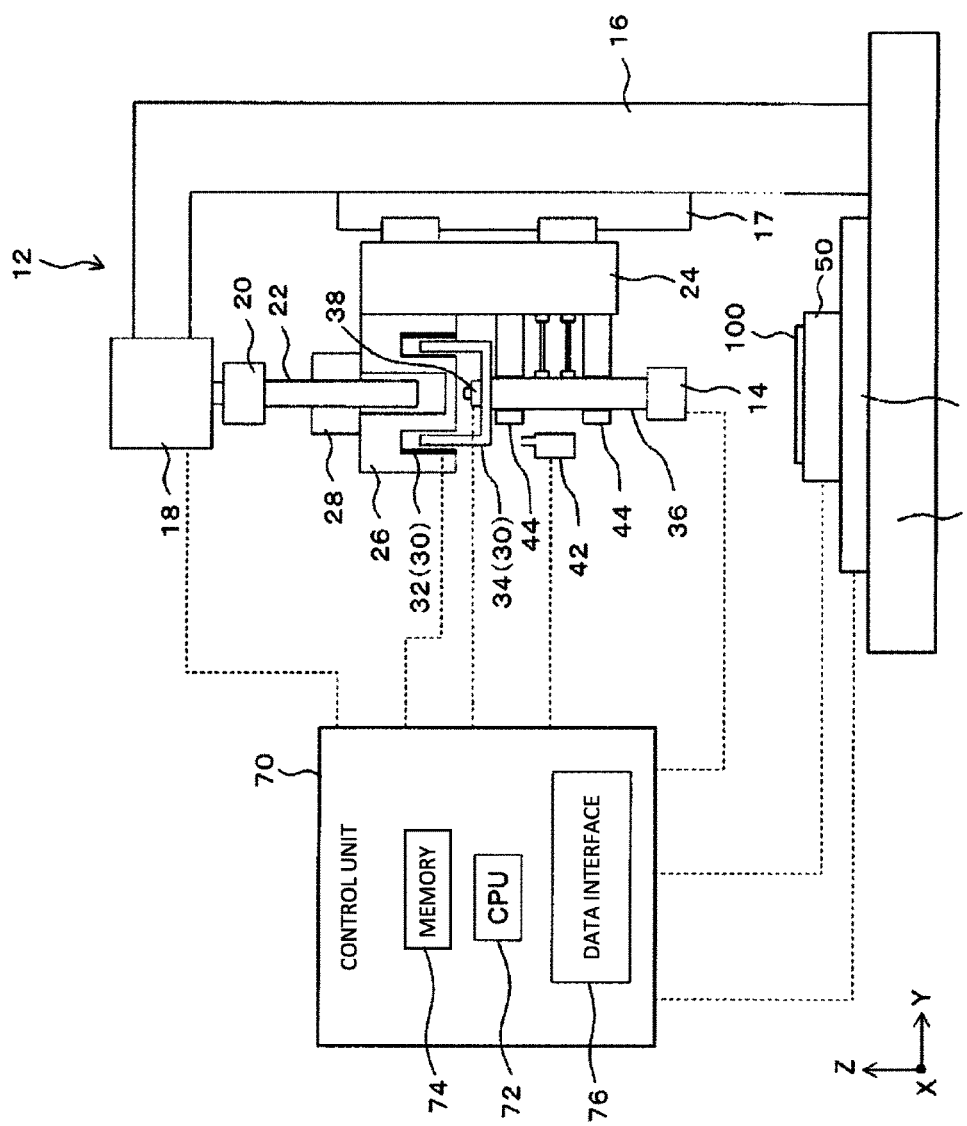
FIG. 2 is a schematic configurational diagram of the mounting apparatus.
Figure 3:
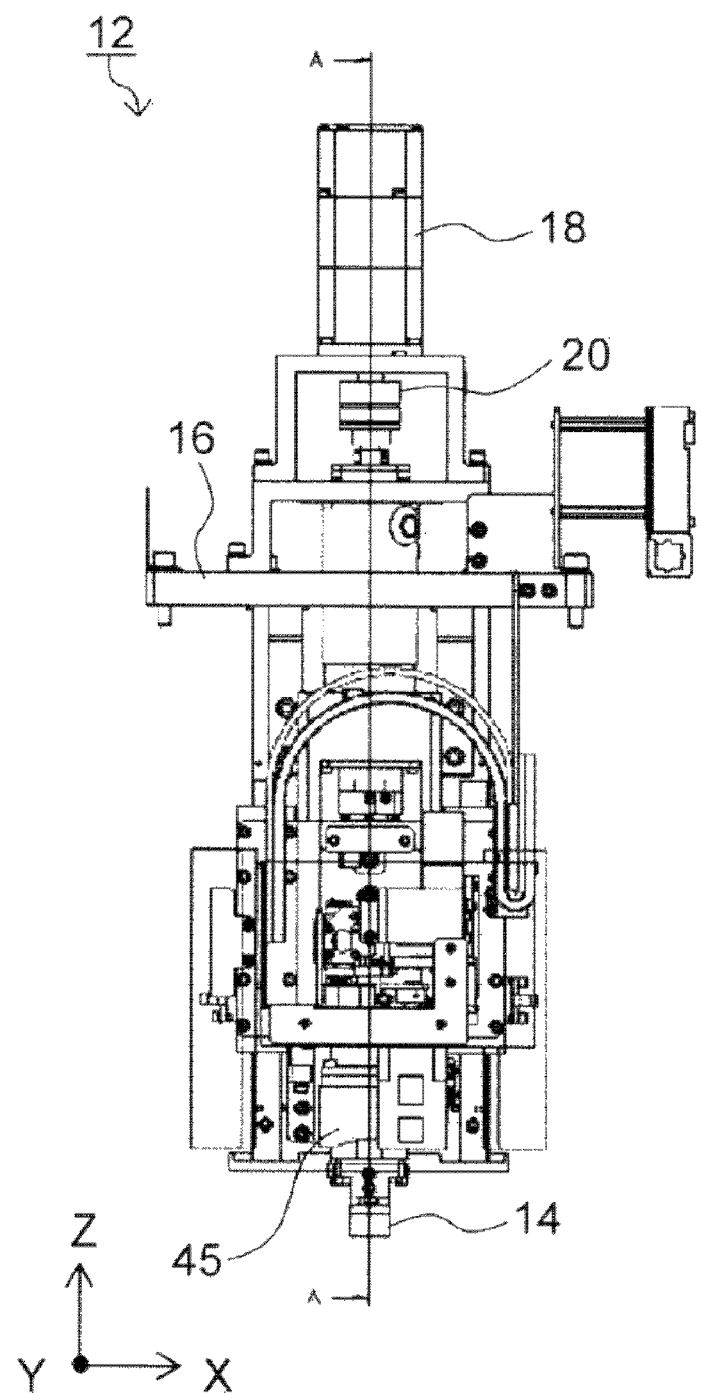
FIG. 3 is a front view of a mounting tool.
Figure 4:
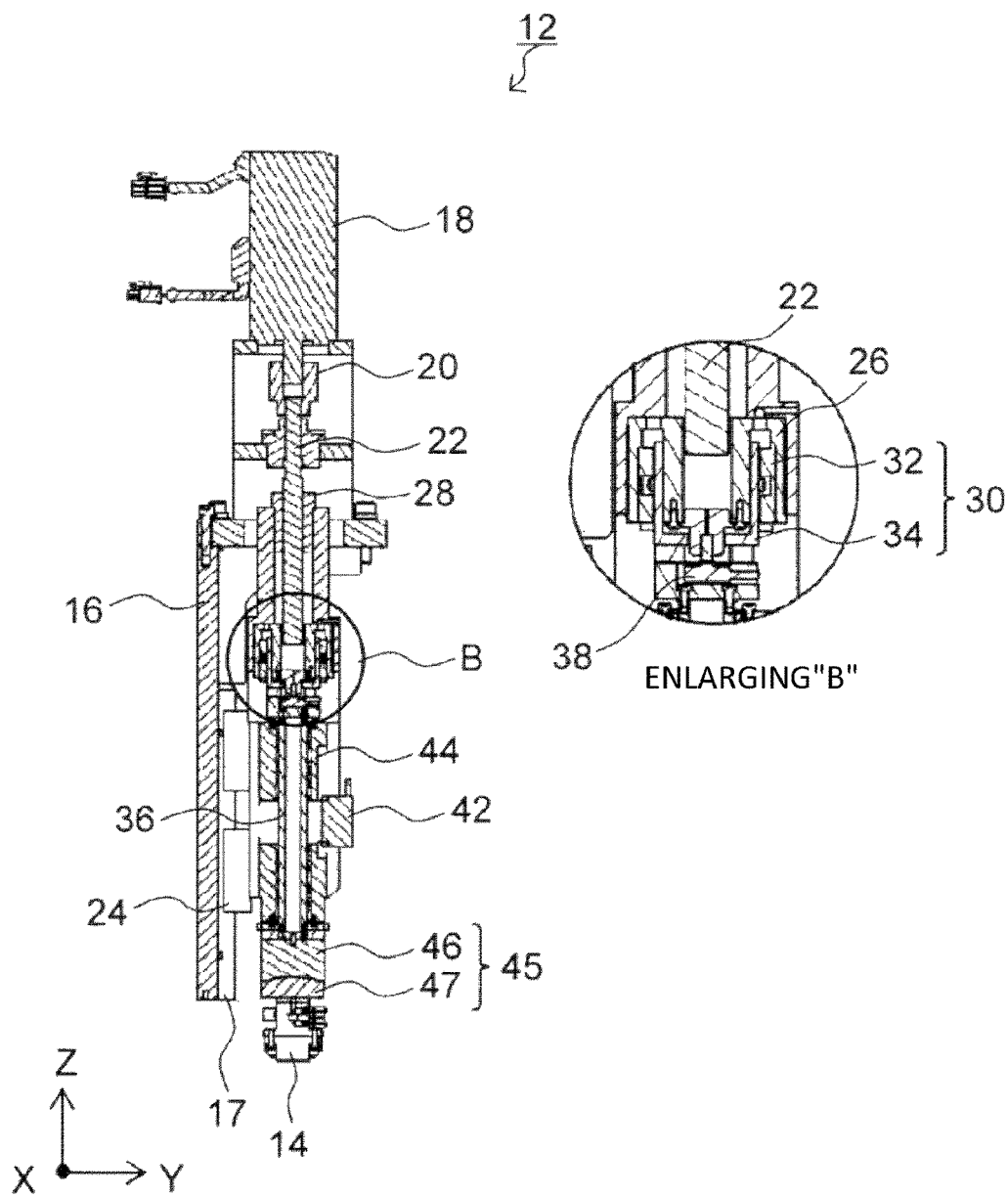
FIG. 4 is a cross-sectional view taken along line A-A in FIG. 3.

Hereinafter, an embodiment of the disclosure will be described with reference to the drawings. FIG. 1A is a perspective view of an electronic component mounting apparatus 10 according to the embodiment of the disclosure, and FIG. 1B is an enlarged view of a main part of the mounting apparatus 10. Further, FIG. 2 is a schematic configurational diagram of the mounting apparatus, FIG. 3 is a front view of a mounting head 12, and FIG. 4 is a cross-sectional view taken along line A-A in FIG. 3.

The mounting apparatus 10 is an apparatus that mounts a semiconductor chip as an electronic component in a face-down state to a substrate 100, and is a flip-chip mounting apparatus, for example. The mounting apparatus 10 includes the mounting head 12 having a mounting tool 14, chip feeding means for feeding a semiconductor chip to the mounting tool 14 (not illustrated), a substrate stage 50 on which the substrate 100 is placed, an XY stage 52 for moving the substrate stage 50 in an XY direction (in a horizontal direction), and the like.

The semiconductor chip is fed to the mounting tool 14 by the chip feeding means. Various configurations are conceivable as the chip feeding means. For example, it is possible to conceive of a configuration in which a semiconductor chip is picked up from a wafer placed on a wafer stage and transferred to an intermediate stage using an intermediate arm. In this case, the XY stage 52 transfers the intermediate stage immediately below the mounting tool 14, which picks up a semiconductor chip from the intermediate stage positioned immediately below the mounting tool 14.

Upon pickup of the semiconductor chip by the mounting tool 14, subsequently, the substrate 100 is transferred immediately below the mounting tool 14 by the XY stage 52. In this state, the mounting tool 14 moves down toward the substrate 100, performs mounting by bonding the semiconductor chip suctioned and held at a tip end of the tool onto the substrate 100.

The mounting head 12 is fixedly attached to a frame 54 that stands on a base 11 of the mounting apparatus 10, and its horizontal position is fixed. At an opposite position of the mounting head 12, the substrate stage 50 holding the substrate 100 is provided. The substrate stage 50 is provided with a heating device for heating the substrate 100 and the like. The substrate stage 50 is disposed on the XY stage 52, and moves in the horizontal direction as needed according to an instruction from a control unit (controller) 70.

Further, near the substrate stage 50, a contact pin 60, a jig stage 62 on which a measurement jig 64 is placed, a camera unit 66, and the like are provided. Both of the contact pin 60 and the measurement jig 64 are used in order to inspect and adjust a condition of a holding surface 14a of the mounting tool 14.

The contact pin 60 is disposed on the XY stage 52 at a position near the substrate stage 50, and a pin projecting upward (i.e., toward the mounting tool 14). The contact pin 60 is made of a metal having a low thermal expansion coefficient, e.g., a cast-iron material which is known by the product name of nobinite (registered trademark). A tip end of the contact pin 60 is in a conical shape, and may be brought into contact with the measurement jig 64 suctioned and held by the mounting tool 14 at one point. The contact pin 60 and the control unit 70 of the mounting apparatus 10 that performs arithmetic processing serve as an angle detection mechanism that measures an inclination of the measurement jig 64 held by the mounting tool 14.

The measurement jig 64 is a plate suctioned and held by the holding surface 14a during inspection of the holding surface 14a. The measurement jig 64 has a planar-plated shape having an even thickness, as well as a flat top surface and a flat bottom surface. The measurement jig 64 also has a size for entirely covering the holding surface 14a of the mounting tool 14. The measurement jig 64 is made of a material, such as glass, that has a low thermal expansion coefficient and whose surface may be easily flattened. The measurement jig 64 is usually placed on the jig stage 62 disposed on the XY stage 52 at a position near the substrate stage 50. When the condition of the holding surface 14a is inspected, the mounting tool 14 is caused to pick up the measurement jig 64 from the jig stage 62 and to hold the measurement jig 64. Then, in this state, the measurement jig 64 is brought into contact with the contact pin 60, and the condition of the holding surface 14a is inspected based on position information of the mounting tool 14 upon contact.

Further, the camera unit 66 for taking an image of the mounting tool 14 and a semiconductor chip held by the mounting tool 14 from underneath is mounted on a side of the substrate stage 50. The camera unit 66, the contact pin 60, and the jig stage 62 are disposed on the XY stage 52, and are moved in a horizontal direction as needed according to an instruction from the control unit 70.

The mounting head 12 is provided with, in addition to the mounting tool 14 for suction-holding a semiconductor chip, a first pressurizing mechanism and a second pressurizing mechanism that move the mounting tool 14 downward to apply a load to a semiconductor chip, a supporting mechanism that supports the mounting tool 14 in a manner freely movable up and down, and a base member 16 fixedly attached to the frame 54.

The base member 16 is a member fixedly attached to the frame 54. A horizontal position and a vertical position of the base member 16 are fixed. To the base member 16, a Z axis motor 18 that constitutes a first pressurizing mechanism, and a Z axis guide rail 17 that guides up and down movement of the supporting mechanism are attached.

The supporting mechanism supports the mounting tool 14 and the second pressurizing mechanism slidably in the vertical direction. The supporting mechanism is provided with a moving body 24 assembled to the Z axis guide rail 17, a motor holder 26, a movement block 28, and the like. The moving body 24, the motor holder 26, and the movement block 28 are coupled to each other, and together slide in the vertical direction. The motor holder 26 is a member for holding a voice coil motor (hereinafter referred to as a "VCM") 30 that constitutes the second pressurizing mechanism. On an upper side of the motor holder 26, there is provided the movement block 28 with which a lead screw 22 that constitutes the first pressurizing mechanism is threaded. As the lead screw 22 rotates, the movement block 28 moves up and down, and thus the motor holder 26 the moving body 24, the VCM 30, and the mounting tool 14 that are coupled to the movement block 28 move up and down.

The first pressurizing mechanism is a movement mechanism that moves the mounting tool 14 together with the supporting mechanism in the vertical direction, and is a mechanism that applies a relatively high first load to a semiconductor chip. By the first pressurizing mechanism, the mounting tool 14 moves downward toward the substrate 100, and a semiconductor chip suctioned and held at the tip end of the mounting tool 14 is pressed against the substrate 100. At this time, the load applied to the semiconductor chip takes a relatively high value, e.g. from 10 N to 500 N.

The first pressurizing mechanism includes the Z axis motor 18 coupled to the base member 16, and the lead screw 22 coupled to an output shaft of the Z axis motor 18 via a coupling 20. As the Z axis motor 18 is driven, the lead screw 22 rotates, and the movement block 28, and thus the second pressurizing mechanism and the mounting tool 14, moves up and down. It should be noted that the configuration of the first pressurizing mechanism described here is one example, and the configuration of the first pressurizing mechanism is not particularly limited as long as the mounting tool 14, the second pressurizing mechanism, and the supporting mechanism may be moved together in the vertical direction. For example, as a drive source of the pressurizing mechanism, an air cylinder, a hydraulic cylinder, or the like may be used instead of the motor.

The second pressurizing mechanism is a movement mechanism that is disposed between the supporting mechanism and the mounting tool 14, and that moves the mounting tool 14 with respect to the supporting mechanism. As compared to the first pressurizing mechanism, the second pressurizing mechanism applies a relatively low second load to the semiconductor chip. By the second pressurizing mechanism, the mounting tool 14 moves downward toward the substrate 100, and the semiconductor chip suctioned and held at the tip end of the mounting tool 14 is pressed against the substrate 100. At this time, the load applied to the semiconductor chip takes a relatively low value, e.g. from 0.1 N to 50 N.

The second pressurizing mechanism employs the VCM 30 as a drive source. The VCM 30 includes a stator 32 substantially in a cylindrical shape having permanent magnets arranged along its inner peripheral surface, and a mover 34 disposed within the stator 32 concentrically with the stator 32. The stator 32 is held by the motor holder 26. The mover 34 is a member substantially in a cylindrical shape around which a coil is wound, and moves forward and backward with respect to the stator 32 in an axial direction by applying current to the coil. It should be noted that the configuration of the second pressurizing mechanism described here is one example, and the configuration of the second pressurizing mechanism is not particularly limited as long as the mounting tool 14 may be moved in the vertical direction with respect to the supporting mechanism.

To the mover 34 of the VCM 30, a sliding shaft 36 is coupled. The sliding shaft 36 is a member disposed between the mover 34 and the mounting tool 14, and moves in the vertical direction together with the mover 34. To the supporting mechanism, a protective member 44 that covers around the sliding shaft 36 is fixedly attached. The protective member 44 includes a through hole whose diameter is slightly larger than that of the sliding shaft 36, and the sliding shaft 36 moves forward and backward through the through hole. At a tip end of the sliding shaft 36, a tool supporting mechanism 45 holds the mounting tool 14 in a manner its posture can be changed is attached.

Between the mover 34 of the VCM 30 and the motor holder 26, the load cell 38 is provided. The load cell 38 is a pressure detector for detecting a load applied to a semiconductor chip via the mounting tool 14. When a relatively high load is applied using the first pressurizing mechanism, precompression is generated in the load cell 38 by moving the mover 34 of the VCM 30 upward and bringing the load cell 38 into contact with the motor holder 26.

To the supporting mechanism, a linear scale 42 is also fixedly attached. The linear scale 42 measures a displacement amount of the sliding shaft 36, and thus the mounting tool 14, with respect to the supporting mechanism. Then, the linear scale 42 detects a position of the mounting tool 14 in a Z-axial direction based on the displacement amount.

Figure 5:
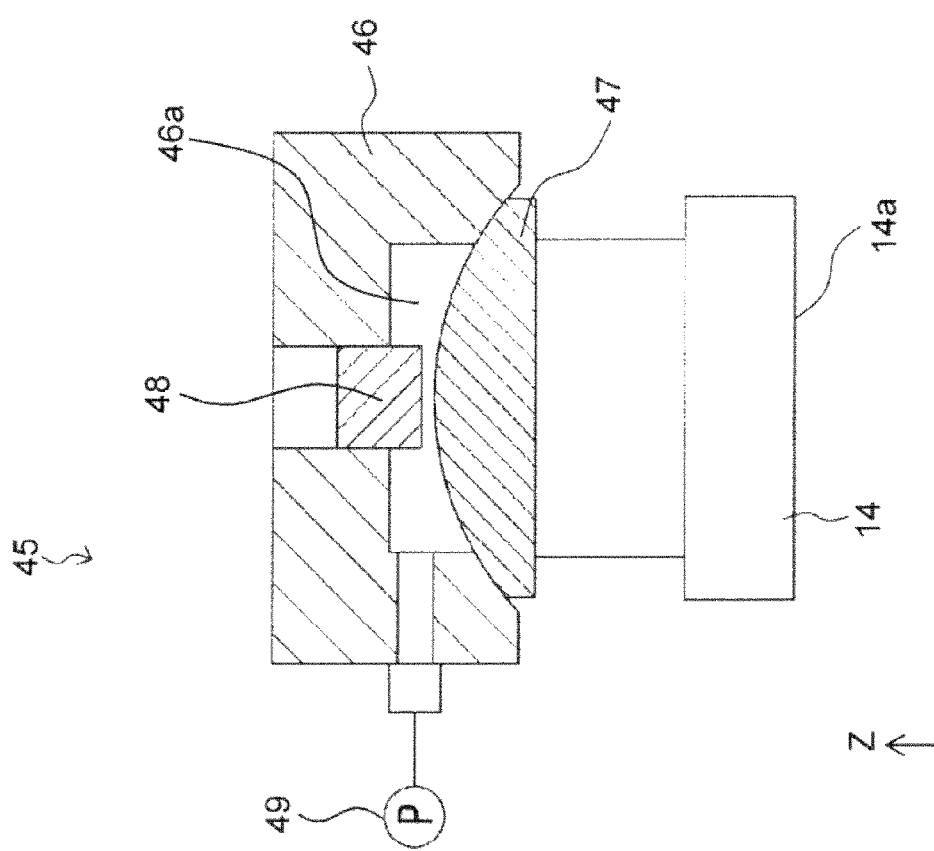
FIG. 5 is a diagram illustrating a configuration of a tool supporting mechanism.

The tool supporting mechanism 45 may lock or unlock the posture of the mounting tool 14 using a mechanism for holding the mounting tool 14. FIG. 5 is a schematic diagram illustrating a configuration of the tool supporting mechanism 45. The tool supporting mechanism 45 is generally constituted by a stationary unit 46 fixedly attached to the sliding shaft 36, and a movable unit 47 capable of moving with respect to the stationary unit 46. A bottom surface of the stationary unit 46 is formed in a concave spherical surface. Further, a cavity 46a that communicates with the concave spherical surface is provided within the stationary unit 46, and the cavity 46a also communicates with a pump 49 provided outside. By driving the pump 49, the cavity 46a is supplied with compressed air or subjected to vacuum suction. In addition, a magnet 48 for suctioning and holding the movable unit 47 is provided within the cavity 46a.

The movable unit 47 is configured such that a top surface of the movable unit 47 is formed in a convex spherical surface that corresponds to the concave spherical surface, and the mounting tool 14 is attached to a bottom surface of the movable unit 47. The posture of the movable unit 47, and thus the mounting tool 14, is locked by vacuum-suctioning of the cavity 46a, and unlocked by supplying compressed air to the cavity 46a. Specifically, when the cavity 46a is vacuum-suctioned, the movable unit 47 is brought into close contact with and fixed to the concave spherical surface of the stationary unit 46 by the vacuum suction force and a magnetic suction force of the magnet 48, and the posture of the movable unit 47 may hardly be changed. On the other hand, by supplying compressed air to the cavity 46a, the movable unit 47 is moved downward against the magnetic suction force of the magnet 48. At this time, by adjusting an amount of compressed air to be supplied so that the magnetic suction force of the magnet 48 and a repelling force of the compressed air are balanced, a small gap is formed between the movable unit 47 and the concave spherical surface, and a sliding resistance between the movable unit 47 and the stationary unit 46 is reduced to a large extent. As a result, the movable unit 47 may move freely with respect to the stationary unit 46, and change its posture freely.

Figure 6:
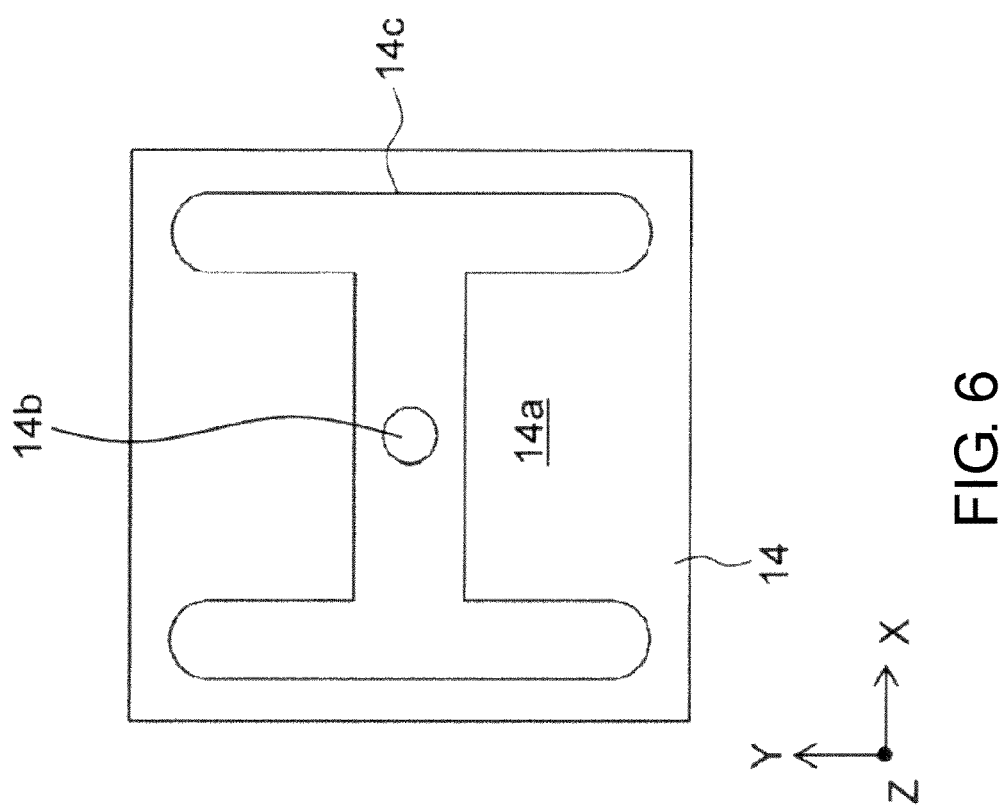
FIG. 6 is a diagram illustrating a bottom surface of a holding surface.

The mounting tool 14 is a section for suctioning and holding a semiconductor chip. A tip end surface of the mounting tool 14 forms the holding surface 14a for suctioning and holding a semiconductor chip. FIG. 6 is a diagram illustrating one example of the holding surface 14a. The holding surface 14a normally includes at least one suction hole 14b for suctioning a semiconductor chip. The suction hole 14b communicates with a vacuuming pump (not illustrated) provided outside the mounting tool 14. The holding surface 14a also includes a suction groove 14c communicating with the suction hole 14b. Here, while the suction groove 14c in FIG. 6 is substantially in an H shape, the shape of the suction groove 14c varies as appropriate depending on the type of the mounting apparatus 10.

The control unit 70 is provided with a CPU 72 that performs various types of arithmetic processing, a memory 74 that records various data and programs, and a data interface 76 that manages input and output of data. The memory 74 records programs for executing mounting control and various data. Further, the CPU 72 executes various types of arithmetic processing based on values detected by sensors such as the load cell 38 and the linear scale 42, and outputs control signals for driving the pressurizing mechanism, the XY stage 52, a heater provided for the substrate stage 50, and the like through the data interface 76 according to the programs recorded in the memory 74.

When a semiconductor chip is mounted onto the substrate 100 using the mounting apparatus 10 described above, naturally, a semiconductor chip is suctioned and held by the tip end of the mounting tool 14, and the semiconductor chip in this state is pressed against the substrate 100. At this time, unless a surface of a semiconductor chip held by the mounting tool 14 is parallel with the substrate 100, it is not possible to apply a load evenly on an entire surface of the semiconductor chip, and this results in deterioration of mounting accuracy.

Therefore, conventionally, there has been proposed a technique for measuring and inspecting an inclination of the holding surface 14a. For example, it is conceived that a sensor for inclination measurement such as a displacement sensor is provided on the XY stage 52, and the inclination of the holding surface 14a is measured using the sensor for inclination measurement. However, additionally providing such a sensor for inclination measurement increases and complicates electrical wiring. Further, normally, when a semiconductor chip is mounted, the substrate 100 and the mounting tool 14 are heated to a high temperature, and therefore the temperature around a portion where the sensor for inclination measurement is provided is also likely increased. Under such a high-temperature environment, it is difficult to maintain accuracy of the sensor, and a sensor with high temperature limit is very expensive.

Therefore, in some quarters, it is proposed a technique for measuring the inclination of the holding surface 14a by fixedly providing a contact pin for a surface facing toward the holding surface 14a and bringing the holding surface 14a into contact with the contact pin. Specifically, it is proposed to bring the contact pin into contact with a plurality of points on the holding surface 14a, and measure the inclination of the holding surface 14a based on heightwise positions of the mounting tool 14 upon contact. As this technique does not require an additional sensor for inclination measurement, it is possible to simplify electrical wiring and to reduce costs.

Figure 11:
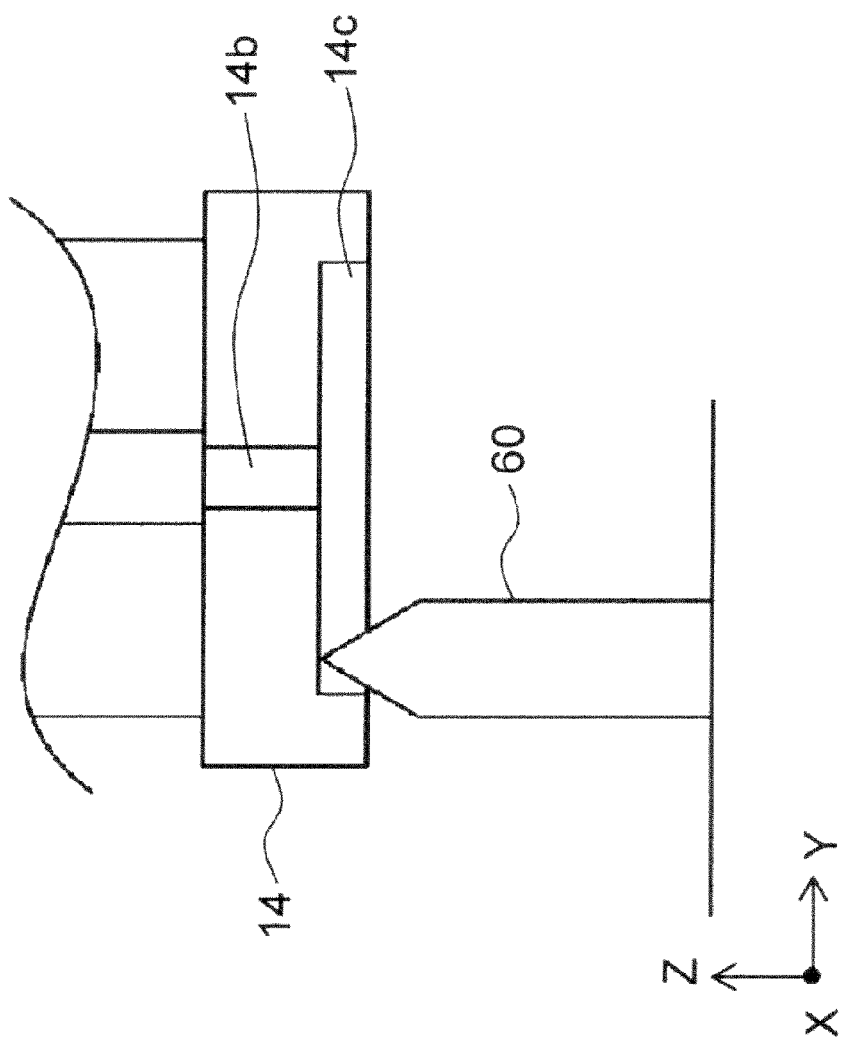
FIG. 11 shows views illustrating how the inspection of the holding surface is conventionally performed.

However, according to the conventional technique, the contact pin is directly brought into contact with the holding surface 14a. In this case, it is possibly not able to correctly detect the inclination of the holding surface 14a. Specifically, as described above, the holding surface 14a normally includes the suction hole 14b and the suction groove 14c. As illustrated in FIG. 11, there is a problem that when measuring an inclination, if a tip end of the contact pin 60 is brought into contact with the suction hole 14b or the suction groove 14c, it is not possible to detect a height of the holding surface 14a correctly.

Figure 12:
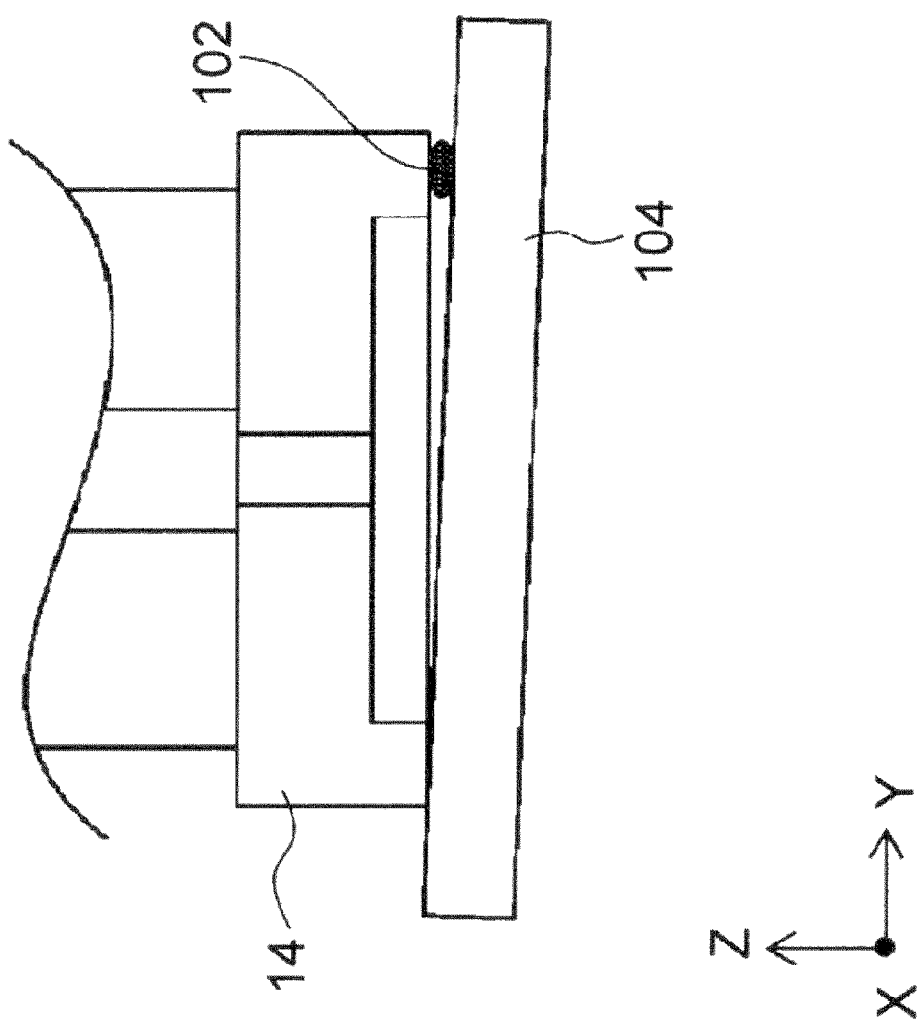
FIG. 12 shows views illustrating how the inspection of the holding surface is conventionally performed.

Further, as the contact pin 60 is brought into contact only with a part of the holding surface 14a in the conventional technique, even if a foreign matter such as trash is attached to the holding surface 14a, such a foreign matter may not be detected. Specifically, in a process of repeatedly mounting semiconductor chips, a foreign matter such as trash may often be attached to the holding surface 14a. As illustrated in FIG. 12, if a semiconductor chip 104 is suctioned using the holding surface 14a in a state in which such a trash 102 is attached, the semiconductor chip 104 should be inclined even if the holding surface 14a is parallel with the substrate 100. Bonding a semiconductor chip to the substrate 100 in such a state does not allow a load to be applied evenly to an entire surface of the semiconductor chip 104, and thus leads to deterioration of accuracy in mounting mount.

Figure 7B:
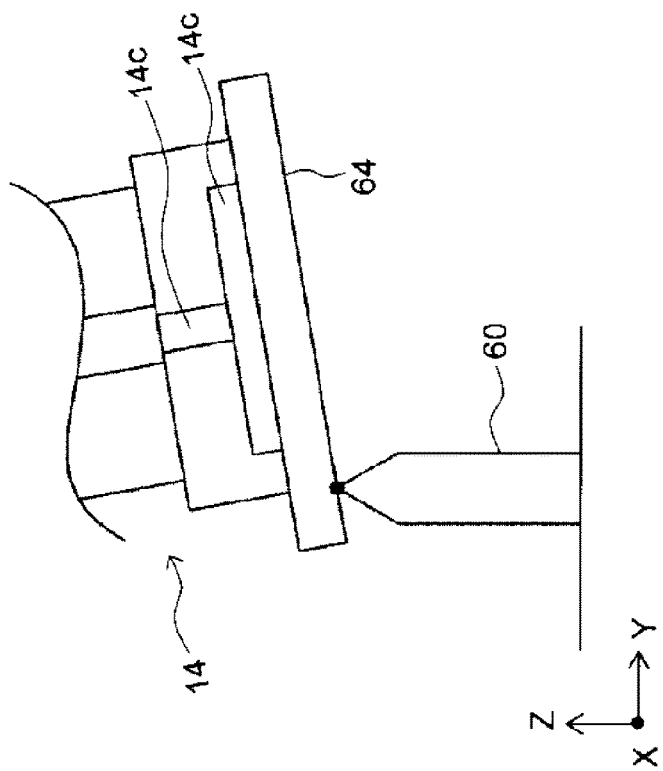
FIG. 7A and FIG. 7B show views illustrating how inspection of the holding surface is performed.
Figure 7A:
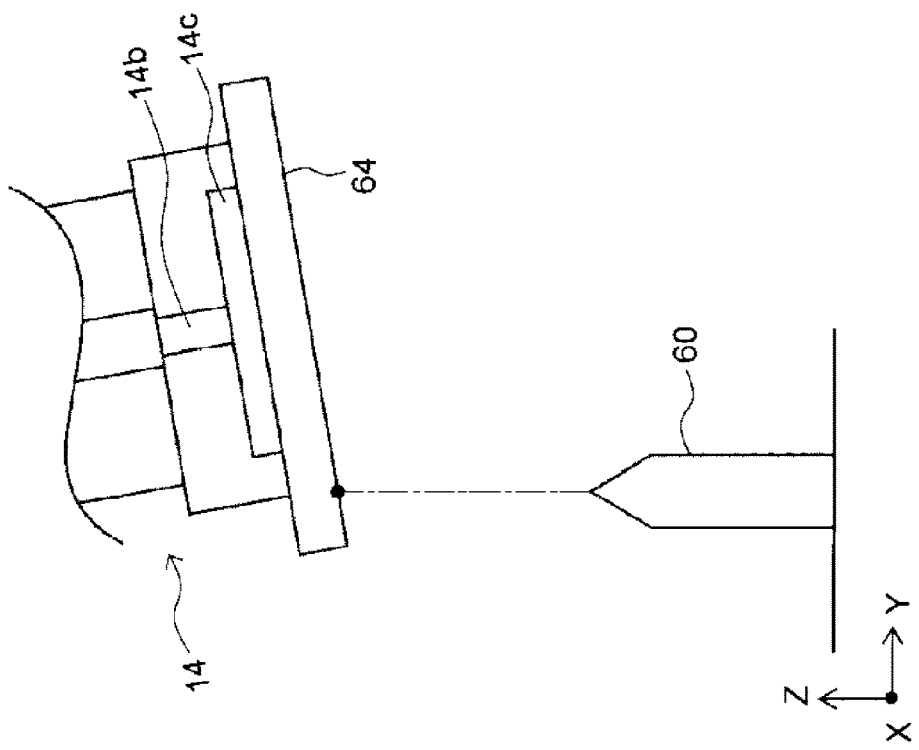

Therefore, instead of additionally providing a sensor or the like as in the above conventional technique, this embodiment employs the measurement jig 64 in order to ensure detection of the condition of the holding surface 14a. Such a configuration will be described with reference to FIG. 7A and FIG. 7B. FIG. 7A and FIG. 7B show views illustrating how the inspection is performed. As described above, when the holding surface 14a is inspected, the measurement jig 64 is suctioned and held by the holding surface 14a. Here, the measurement jig 64 has a planar plated shape having an even thickness, as well as a flat top surface and a flat lower surface. Therefore, if there is no foreign matter or the like attached to the holding surface 14a, the lower surface of the measurement jig 64 suctioned and held by the holding surface 14a is parallel with the holding surface 14a. Therefore, it is possible to estimate the inclination of the holding surface 14a by measuring an inclination of the lower surface of the measurement jig 64.

In this embodiment, the XY stage 52 is driven in a state in which the measurement jig 64 is suctioned and held by the holding surface 14a, and as illustrated in FIG. 7A, a prescribed measurement point on the measurement jig 64 and the tip end of the contact pin 60 are caused to face each other and aligned in the Z-axial direction. Subsequently, the VCM 30 is operated, and the mounting tool 14 is moved downward along the Z axis. Then, when the measurement jig 64 and the tip end of the contact pin are brought into contact with each other, the downward movement of the mounting tool 14 stops. Upon detection of the stopping of the downward movement by the linear scale 42, the control unit 70 determines that the measurement jig 64 and the contact pin 60 are brought into contact with each other, and stops driving the VCM 30. Then, the control unit 70 records an amount of the downward movement of the mounting tool 14 until it is brought into contact with the contact pin 60, as heightwise position information of the measurement point. Upon detection of the contact between a single measurement point and the contact pin, the control unit 70 drives the VCM 30 and moves the mounting tool 14 upward to make the measurement jig 64 be distant from the contact pin 60. Thereafter, the contact operation and the measurement operation are performed at another measurement point in the same manner. Here, a number and positions of measurement points to be measured are not particularly limited, as long as three or more points that are not aligned in a single straight line are provided. However, in order to reduce occurrence of measure errors, it is desirable that a plurality of measurement points be distant from each other. In this embodiment, measurement points are provided respectively at four corners of the measurement jig 64 in a rectangular shaped. In other words, total four points are provided as the measurement point.

When the heightwise position information for all of the measurement points is obtained, the inclination of the measurement jig 64 is calculated based on relation between the measurement points. For example, taking the heightwise position information obtained at one measurement point as a reference, a value of difference between the heightwise position information (the amount of downward movement of the mounting tool 14) of this reference and the heightwise position information (the amount of downward movement of the mounting tool 14) at a different measurement point is obtained. If any of the obtained difference values is no smaller than predetermined threshold value, it is determined that parallelism of the measurement jig 64 has not reached a desired value.

Here, two cases are conceivable as a reason why the parallelism of the measurement jig 64 has not reached a desired value; the posture of the mounting tool 14 is inappropriate, and a foreign matter is attached to the holding surface 14a of the mounting tool 14. Various means can be considered as a method for determining either of the above reasons causes the inclination of the measurement jig 64. For example, an image of the holding surface 14a of the mounting tool 14 is taken using the camera unit 66 provided for the XY stage 52 to determine whether or not a foreign matter is attached based on the obtained image. Further, it is possible to employ another method in which the parallelism is measured via the measurement jig 64, the measurement jig 64 is removed, and then again the parallelism is measured. Specifically, the contact pin 60 is brought into direct contact with the holding surface 14a, and the parallelism of the holding surface 14a is measured based on an amount of downward movement of the mounting tool 14 (heightwise position information) and the like at this time. If the parallelism of the holding surface 14a coincides with the parallelism of the measurement jig 64 as a result, it is determined that the posture of the mounting tool 14 is unfavorable. By contrast, if the parallelism of the holding surface 14a is largely different from the parallelism of the measurement jig 64, it is considered that a foreign matter of some type is attached to the holding surface 14a of the mounting tool 14. Here, when the contact pin 60 is directly brought into contact with the holding surface 14a of the mounting tool 14, the measurement points are set so that the contact pin 60 may not be brought into contact with the suction hole 14b or the suction groove 14c.

If it is determined that a foreign matter is attached to the holding surface 14a, the inclination of the measurement jig 64 held by the holding surface 14a is measured again after the foreign matter is removed. Further, if it is determined that the posture of the mounting tool 14 is unfavorable, the posture of the mounting tool 14 is adjusted. In order to adjust the posture of the mounting tool 14, several ways are conceivable. For example, it is conceivable that a reference surface that is parallel with the substrate stage 50 is prepared in advance, and when the posture of the mounting tool 14 is adjusted, the holding surface 14a of the mounting tool 14 is pressed against the reference surface in a state in which the posture of the mounting tool 14 is unlocked.

Further, as another way, it is conceivable that the posture of the mounting tool 14 is adjusted by pushing the contact pin 60 upward by the holding surface 14a via the measurement jig 64. Specifically, height of a central point of the measurement jig 64 is calculated as a reference height based on the heightwise position information for the four measurement points of the measurement jig 64. Subsequently, the posture of the mounting tool 14 is unlocked by stopping vacuum suction to the cavity 46a and starting supplying compressed air by the tool supporting mechanism 45. In this state, the contact pin 60 is positioned immediately below one of the four measurement points that is lower than the central point. In this state, the mounting tool 14 is moved downward, and the contact pin 60 is pressed against the measurement point. At this time, as the posture of the mounting tool 14 is unlocked, the mounting tool 14 gradually changes its posture upon reception of a pressing force from the contact pin 60 transmitted via the measurement jig 64. Then, when the contact point finally reaches the reference height (the height of the central point), the downward movement is stopped and the mounting tool 14 is moved upward so as to have the mounting tool 14 move away from the contact pin 60. Thereafter, the same process is performed to all of the measurement points that are lower than the reference height.

Here, even when the horizontal position of the contact pin 60 is the same, a contact point with the contact pin 60 on the measurement jig 64 is different depending on the inclination of the measurement jig 64. In other words, when the measurement jig 64 is inclined, displacement occurs between a measurement point that is previously set and an actual contact point. Such displacement can be a cause of an error in the measurement result of the inclination and adjustment result of the inclination described above. However, by repeatedly performing measurement and adjustment of the inclination of the measurement jig 64 employing the contact pin 60, such an error may be gradually reduced, and it is possible to adjust the measurement jig 64 (and thus the holding surface 14*a*) to be parallel with the substrate stage 50.

Figure 8:
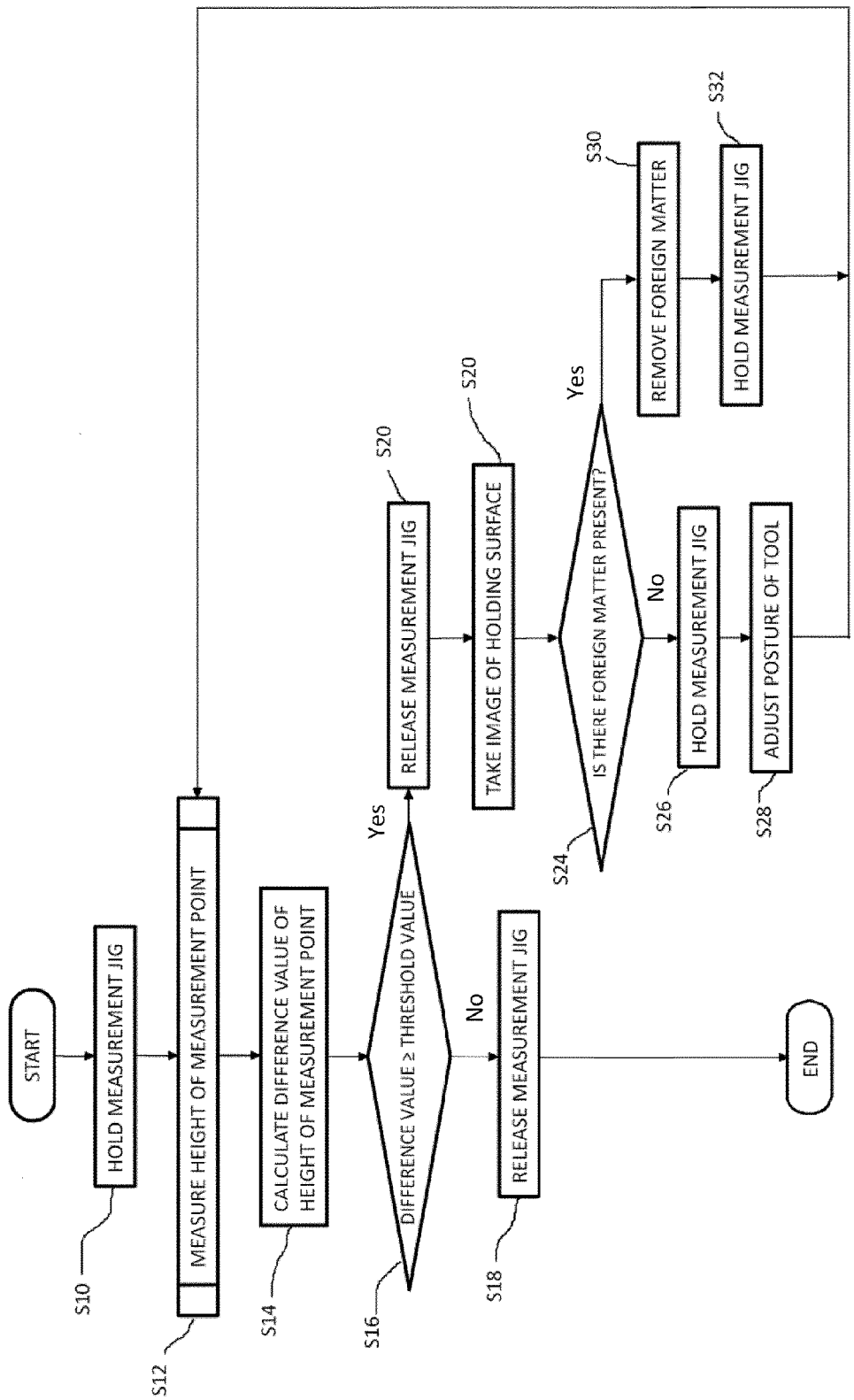
FIG. 8 is a flowchart showing a flow of the inspection and adjustment of the holding surface.
Figure 9:
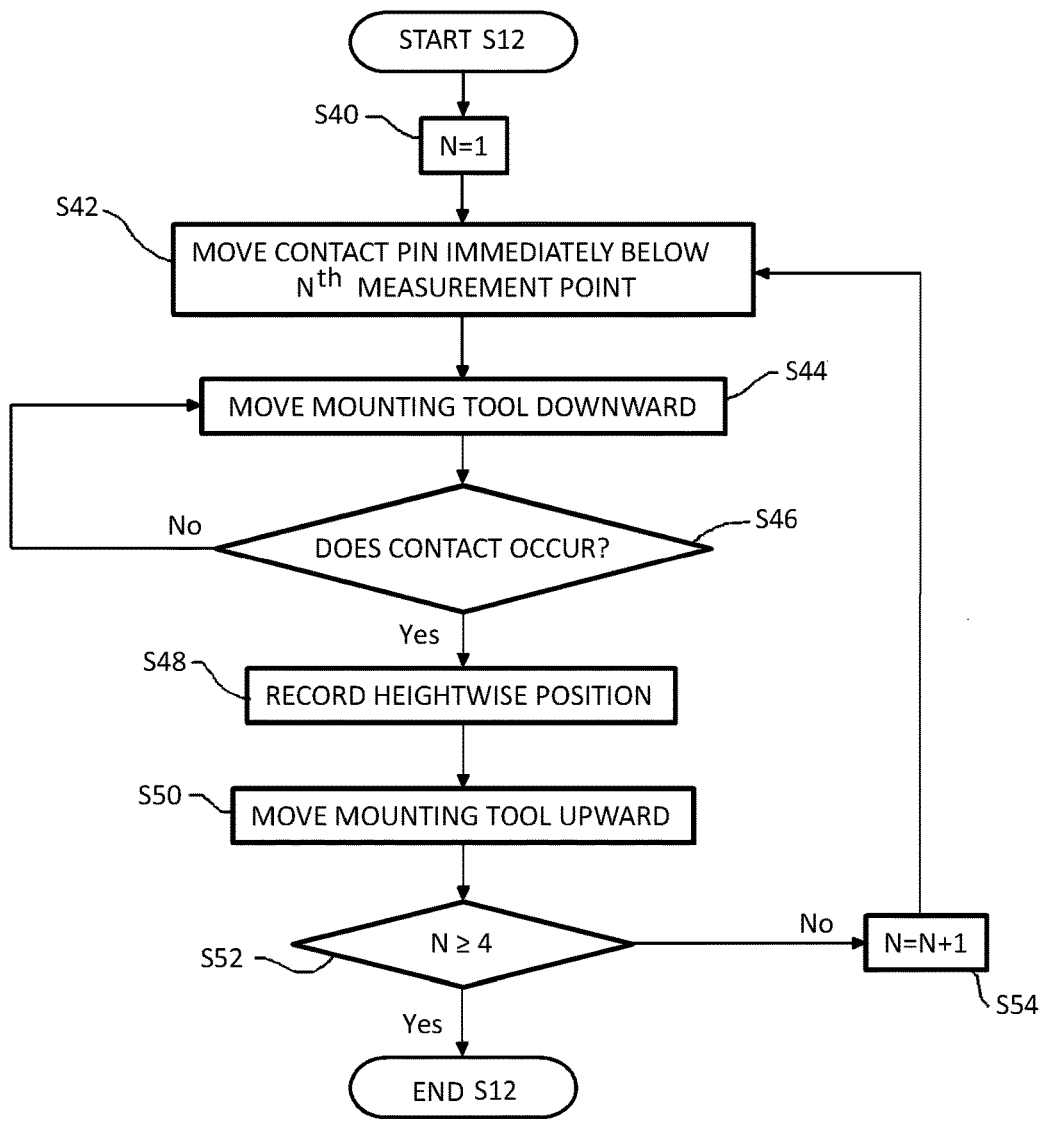
FIG. 9 is a flowchart showing a flow of the inspection of the holding surface.
Figure 10:
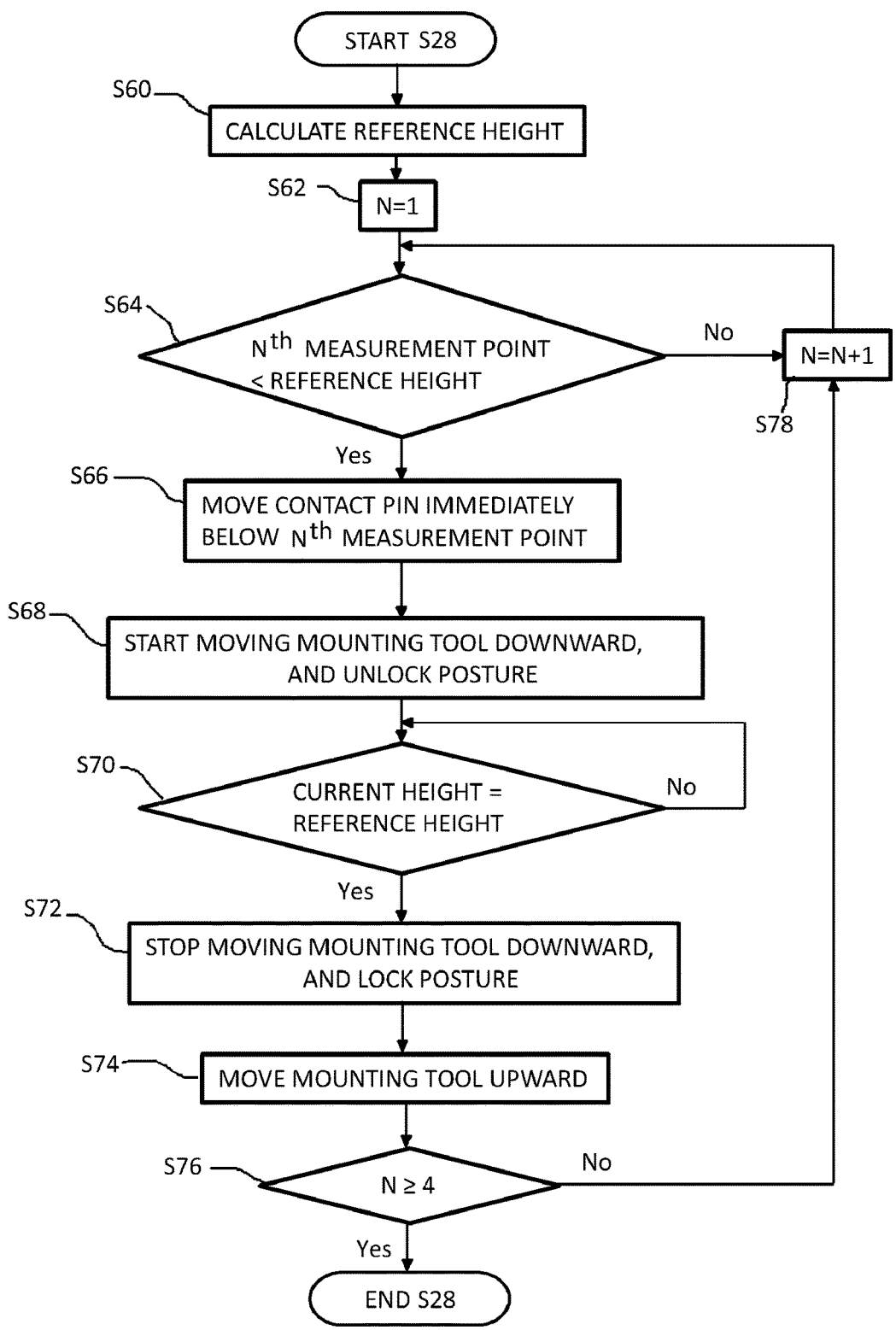
FIG. 10 is a flowchart showing a flow of the adjustment of the holding surface.

Next, flows of the inspection and the adjustment of the condition of the holding surface 14*a* of the mounting tool 14 according to this embodiment will be described with reference to FIG. 8 through FIG. 10. FIG. 8 through FIG. 10 are flowcharts showing the flows of the inspection and the adjustment of the condition of the holding surface 14*a* of the mounting tool 14.

When the condition of the holding surface 14*a* of the mounting tool 14 is inspected and adjusted, first, the holding surface 14*a* of the mounting tool 14 is suctioned and held by the measurement jig 64 (S10). Subsequently, in this state, heights of the four measurement points that are previously defined are measured (S12). Specifically, the XY stage 52 is first driven, and the contact pin 60 is moved immediately below first one of the measurement points of the measurement jig 64 (S40, S42). Then, the mounting tool 14 is moved downward until the measurement jig 64 is brought into contact with the contact pin 60 (S44, S46). Such contact may be detected by monitoring a value of the linear scale 42, for example. The same procedure is performed to each of the remaining three measurement points, in which procedure upon contact of the measurement jig 64 with the contact pin 60, the heightwise position of the mounting tool 14 at this time is recorded, and the mounting tool 14 is moved upward so as to move away from the contact pin 60 (S48, S50). Then, when the heightwise positions of all of the measurement points are detected, the operation moves to Step S14.

In Step S14, a difference value of the heightwise position for each of the four obtained measurement points is calculated. Then, the obtained difference value is compared with the previously defined threshold value (S16). If, as a result of the comparison, the difference value is found to be smaller than the threshold value, it is determined that the measurement jig 64, and thus the holding surface 14*a*, is substantially parallel with the substrate stage 50. In this case, the measurement jig 64 by the mounting tool 14 is released (S18).

On the other hand, if the difference value is no smaller than the threshold value, it is determined that there is a problem in the condition of the holding surface 14*a*. In this case, whether or not a foreign matter is attached to the holding surface 14*a* is inspected first (S20 to S24). In the example shown in FIG. 8, whether or not a foreign matter is attached is determined based on an image taken by the camera unit 66. If, as a result of the inspection, a foreign matter is found to be attached to the holding surface 14*a*, the operation returns to Step S12 after the foreign matter is removed (S30) and the measurement jig 64 is again held, and again the condition of the holding surface is inspected.

If there is no foreign matter attached to the holding surface 14*a*, it is determined that the posture of the mounting tool 14 is unfavorable. In this case, after the measurement jig 64 is held by the mounting tool 14 (S26), the posture of the mounting tool 14 is adjusted (S28). Specifically, first, the height of the central point of the measurement jig 64 is calculated as the reference height based on the heightwise positions for the four measurement points of the measurement jig 64 (S60). Then, it is determined whether or not a heightwise position of the first one of the measurement points is lower than the reference height (S62, S64). If, as a result of the determination, the heightwise position is found to be higher than the reference height, the same determination is performed for a subsequent one of the measurement points.

On the other hand, if the height of the measurement point is lower than the reference height, the contact pin 60 is moved immediately below the measurement point (S66). Then, in this state, the downward movement of the mounting tool 14 is started, and the posture of the mounting tool 14 is unlocked (S68). Specifically, the tool supporting mechanism 45 supplies compressed air to the cavity 46*a* to form a small gap between the stationary unit 46 and the movable unit 47. With the downward movement of the mounting tool 14, the mounting tool 14, and thus the movable unit 47 that holds the mounting tool 14, receives a moment, as the measurement jig 64 is brought into contact with the contact pin 60. In the state in which the posture is unlocked, the movable unit 47 slides along the concave spherical surface upon reception of the moment so that the measurement points move upward. Then, finally, when the heightwise positions of the measurement points reach the reference height, the downward movement of the mounting tool 14 is stopped and the posture of the mounting tool 14 is locked (S70, S72). Thereafter, the mounting tool 14 is moved upward so as to be moved away from the contact pin 60 (S74).

After the process of Steps S64 through S74 described above is performed to all of the measurement points, the operation returns to Step S12, and again the inspection of the holding surface 14*a* is performed. Then, the above steps are repeated until the difference value of the heightwise position of each of the measurement points finally becomes smaller than the threshold value (until the determination in Step S16 is No).

As can be seen clearly from the previous description, according to this embodiment, the measurement jig 64 suctioned and held by the mounting tool 14 is brought into contact with the contact pin 60 in order to inspect the condition of the holding surface 14*a*. With such a configuration, it is possible to measure the inclination of the holding surface 14*a* easily even if the suction hole 14*b* and the suction groove 14*c* are provided for the holding surface 14*a*. Further, it is possible to detect whether or not a foreign matter is attached to the holding surface 14*a* by providing the measurement jig 64 between the contact pin 60 and the holding surface 14*a*.

It should be noted that the configuration and the flow described above are examples, and may be modified as appropriate as long as the inclination of the measurement jig 64 held by the holding surface 14*a* of the mounting tool 14 may be measured and the condition of the holding surface 14*a* may be determined based on the measurement result.

In the example illustrated in FIG. 8, for example, the inspection on whether or not a foreign matter is attached to the holding surface 14*a* is performed when the inclination of the measurement jig 64 is detected (S20 to S24). However, the step of inspection on whether or not a foreign matter is attached may be omitted in such a case in which a foreign matter is not likely attached to the holding surface 14a, for example, immediately after activation of the mounting apparatus. Further, the detection on whether or not a foreign matter is attached is not limited to the method using a camera, and may be performed employing a different method. For example, the inclination of the holding surface 14a may be directly detected after removing the measurement jig 64 from the holding surface 14a, and if a difference between the inclination thus detected and the inclination when the measurement jig 64 is provided is large, it is possible to determine that a foreign matter is attached.

Moreover, according to this embodiment, the inspection and the adjustment are performed so that the holding surface 14a of the mounting tool 14 to be parallel with the substrate stage 50. However, in some cases, it is possible to perform the inspection and the adjustment so that the holding surface 14a forms a particular angle with the substrate stage 50. Furthermore, according to this embodiment, the heightwise positions of the measurement points are measured based on the amount of the downward movement of the mounting tool 14 when the contact pin 60 is brought into contact with the measurement jig 64. However, it is possible to perform the measurement using a different method as long as relative heightwise positions of the plurality of the measurement points of the measurement jig 64 may be measured. For example, using a contact or contactless (optical or ultrasonic) distance sensor or the like, it is possible to measure the relative heightwise positions of the plurality of the measurement points of the measurement jig 64.

The disclosure is not limited to the embodiment described above, and includes any alteration and modification without departing from the technical scope and the spirit of the disclosure as defined in the appended claims.

The invention claimed is:

1. A mounting apparatus for mounting an electronic component onto a substrate, the apparatus comprising:
   a mounting tool configured to hold the electronic component by a holding surface as a tip end surface of the mounting tool;
   a movement mechanism configured to move the mounting tool relatively with respect to the substrate;
   a measurement jig which is planar-plated, held by the holding surface;
   an angle detection mechanism configured to measure an inclination of the measurement jig; and
   a controller configured to control driving of the mounting apparatus, wherein
   during inspection of the holding surface, the controller causes the mounting tool to hold the measurement jig, and the angle detection mechanism to measure the inclination of the measurement jig,
   wherein the angle detection mechanism includes:
      a contact pin fixed and projecting toward the holding surface; and
      a calculating unit configured to calculate the inclination of the measurement jig based on relative position information of the mounting tool when the contact pin is brought into contact sequentially with a plurality of positions on a surface of the measurement jig held by the holding surface,
   wherein the mounting tool further includes a tool supporting mechanism configured to either lock or unlock a posture of the mounting tool, and
   the controller adjusts an inclination of the holding surface by pressing a part of the holding surface against the contact pin via the measurement jig in a state in which a posture lock of the mounting tool by the tool supporting mechanism is unlocked.

2. The mounting apparatus according to claim 1, wherein the measurement jig has a size so as to cover the holding surface entirely.

3. A measuring method of measuring a condition of a holding surface of a mounting tool that holds an electronic component, the measuring method employing a mounting apparatus for mounting the electronic component onto a substrate, the method comprising the steps of:
   preparing the mounting apparatus including a mounting tool configured to hold the electronic component by the holding surface as a tip end surface of the mounting tool, and an angle detection mechanism configured to measure an inclination of a planar-plated measurement jig that is held by the holding surface, wherein the mounting tool further includes a tool supporting mechanism configured to either lock or unlock a posture of the mounting tool;
   holding the planar-plated measurement jig by the holding surface of the mounting tool;
   measuring the inclination of the planar-plated measurement jig using the angle detection mechanism provided for the mounting apparatus, wherein the angle detection mechanism includes a contact pin and a calculating unit, the contact pin is fixed and projecting toward the holding surface, the calculating unit is configured to calculate the inclination of the planar-plated measurement jig based on relative position information of the mounting tool when the contact pin is brought into contact sequentially with a plurality of positions on a surface of the planar-plated measurement jig held by the holding surface;
   determining whether the holding surface is pass or fail, based on the inclination of the planar-plated measurement jig that is being held; and
   adjusting the inclination of the holding surface with a controller by pressing a part of the holding surface against the contact pin via the planar-plated measurement jig in a state in which a posture lock of the mounting tool by the tool supporting mechanism is unlocked.

* * * * *